United States Patent [19]

Yoshida et al.

[11] Patent Number: 4,939,045
[45] Date of Patent: Jul. 3, 1990

[54] MAGNETIC RECORDING MEDIUM

[75] Inventors: Kazuetsu Yoshida, Kodaira; Yoshihiro Shiroishi, Hachioji; Makoto Saito, Tokyo; Norikazu Tsumita, Kanagawa; Takeo Yamashita, Tachikawa; Hiroyuki Suzuki, Kawasaki; Yasushi Kitazaki; Masaki Ohura, both of Odawara; Sadao Hishiyama, Sayama; Tomoyuki Ohno; Yoshibumi Matsuda, both of Kokubunji; Kazumasa Takagi, Tokyo; Katsuhiro Kuroda, Hachioji; Sadanori Nagaike, Odawara, all of Japan

[73] Assignee: Hitachi, Ltd., Tokyo, Japan

[21] Appl. No.: 172,194

[22] Filed: Mar. 23, 1988

[30] Foreign Application Priority Data

Mar. 23, 1987 [JP] Japan .................................. 62-65697
Jul. 8, 1987 [JP] Japan .................................. 62-84731

[51] Int. Cl.$^5$ ............................................ G11B 5/64
[52] U.S. Cl. ...................................... 428/664; 428/668; 428/694; 428/928
[58] Field of Search ............... 428/694, 668, 611, 667, 428/928, 666, 665, 664, 663

[56] References Cited

U.S. PATENT DOCUMENTS

| | | | |
|---|---|---|---|
| 4,520,069 | 5/1985 | Kitamoto et al. | 428/694 |
| 4,550,062 | 10/1985 | Takayama et al. | 428/611 |
| 4,632,883 | 12/1986 | Howard et al. | 428/694 |
| 4,636,448 | 1/1987 | Morita et al. | 425/611 |
| 4,657,813 | 4/1987 | Asai et al. | 428/694 |
| 4,722,862 | 2/1988 | Ogama et al. | 428/694 |
| 4,786,553 | 11/1988 | Shiroishi et al. | 426/694 |
| 4,789,591 | 12/1988 | Nakamura et al. | 428/694 |
| 4,792,486 | 12/1988 | Ishizaka et al. | 428/928 |
| 4,792,497 | 12/1988 | Suzuki et al. | 428/611 |

FOREIGN PATENT DOCUMENTS

| | | | |
|---|---|---|---|
| 3514649 | 10/1985 | Fed. Rep. of Germany | 428/694 |
| 217933 | 9/1986 | Japan | 428/694 |

OTHER PUBLICATIONS

J. C. Lodder et al., "R. F.-Sputtered Co-Cr Layers for Perpendicular Magnetic Recording", Thin Solid Films, 101 (1983), 61-73.

Primary Examiner—John J. Zimmerman
Attorney, Agent, or Firm—Antonelli, Terry, Stout & Kraus

[57] ABSTRACT

Disclosed are a magnetic recording medium having a magnetic recording layer formed of a magnetic thin film in which rotational hysteresis integral $R_H$ is within a range of from 0.4 to 1.3 in the measurement by a torque magnetometer, and a continuous magnetic recording medium in which crystal grains are substantially randomly arranged on the upper surface of a magnetic recording layer or on the surface of a non-magnetic subbing layer, and in which each of the crystal grains is made to be in the form of an ellipsoid or needle and to have a length-ways axial ratio of a major axis to a minor axis not smaller than 2, more preferably, not smaller than 4.

22 Claims, 4 Drawing Sheets

MAGNETIC RECORDING MEDIUM

BACKGROUND OF THE INVENTION

1. Field of the Invention

The present invention relates to magnetic recording media to be used in magnetic disk units or the like, and particularly, relates to a magnetic recording medium having a magnetic recording layer formed of a thin ferromagnetic metal or alloy film. More particularly, the present invention relates to high-performance magnetic recording media which exhibit low noise, which are superior in S/N (signal-to-noise ratio) characteristics, suitable for high-density recording and which exhibit excellent recording/reproducing characteristics.

2. Description of the Prior Art

Heretofore, magnetic recording media using metal or metal oxide magnetic thin films have been proposed as high-density magnetic recording media, as described in Japanese Patent Publication No. 54-33523 (1979). As methods of film formation for those magnetic recording media, generally, sputtering, evaporating, ion-plating and the like have been used. Recently, a demand for high recording density has intensified, and practical use of continuous recording media using metal magnetic films have been started with the advance of medium- or small-scaled disk apparatus.

However, those medium- or small-scaled disk units have a disadvantage in that the disk is small in diameter and therefore low in peripheral speed. Accordingly, two attempts to make the output signal high and to make noise low have been required to thereby make the SN ratio larger.

In the conventional magnetic recording media of the ferromagnetic thin film type, noise produced at the time of magnetic recording/reproducing is caused mainly by the occurrence of a region in which the magnetization direction becomes disordered (magnetization transition region) in the boundary of recording bits, as discussed at page 16 in Digests of the Fifth Annual Conference of Magnetics in Japan (Oct., 1981), the Magnetics Society of Japan.

Magnetic recording media of the ferromagnetic thin film type in which ferromagnetic metal thin films or metal oxide thin films are used as magnetic recording layers (simply referred to as magnetic layers) have an advantage in that the coercive force is large, the saturation flux density is high, and the magnetic layer can easily be made. Those properties are essential for performing high-density recording on magnetic recording media. Therefore, those magnetic recording media are expected as next-generation high-density recording media in place of the magnetic recording media of the particulate type which have been used widely. However, the magnetic recording media of the ferromagnetic thin film type have a disadvantage in that the production of media superior in S/N characteristics is difficult because noise in the magnetic recording media themselves is high, though the reproductive output signal can easily be improved.

Several researches have been carried out about the cause of occurrence of noise in the magnetic recording media of the ferromagnetic thin film type. For example, according to the aforementioned literature (Digests of the Fifth Annual Conference of Magnetics in Japan, Oct., 1981, page 16), a magnetization transition region produced in the boundary of recording bits is pointed out as one of the main causes of noise which occurs at the time of signal recording. This suggests that noise increases substantially proportionally to recording density. Accordingly, reduction of the proportional constant is one of the important factors for producing high-S/N magnetic recording media. However, the relation between noise innate in the magnetic recording media and the magnetic characteristics of the magnetic thin film in the media remains unexplained till now. The fact that it remains unexplained has placed a hurdle on the road to production of high-S/N magnetic recording media.

On the other hand, heretofore, with respect to metallic thin film media, the surface form of the media has been smoothed by reducing sputtering gas pressure for the purpose of improvement in corrosion resistance, as described in Extended Abstracts, 28a-ZH-3 (The 47th Autumn Meeting), The Japan Society of Applied Physics. However, according to the research by the inventors of this application, noise innate in the magnetic recording media having the smooth surfaces is still high so that the recording/reproducing characteristics thereof are not sufficient. It is therefore important to improve those characteristics. Further, so-called "modulation" (modulation of read-signal envelope), exists in the metallic thin film media, as described in Journal of Vacuum Science Technology, A4 (1986), pages 547 to 549. Accordingly, those metallic thin film media are not sufficient in uniformity and reliability.

SUMMARY OF THE INVENTION

A first object of the present invention is to specify magnetic characteristics of magnetic films necessary for reducing noise in magnetic recording media of the ferromagnetic thin film type to thereby provide a magnetic recording medium having high S/N characteristics.

According to a first aspect of the present invention, the foregoing first object is attained by a magnetic recording medium having a magnetic recording layer formed of a magnetic thin film in which rotational hysteresis integral $R_H$ is within a range of from 0.4 to 1.3 in the measurement by a torque magnetometer.

A second object of the present invention is to provide a high-reliable and high-performance magnetic recording medium which is free from modulation, which is excellent in recording/reproducing characteristics and which is superior in corrosion resistance.

According to a second aspect of the present invention, the foregoing second object is attained by a continuous magnetic recording medium in which crystal grains are substantially randomly arranged on the upper surface of a magnetic recording layer or on the surface of a non-magnetic underlayer, and in which each of the crystal grains is made to be in the form of an ellipsoid or needle and to have a lengthways axial ratio of a major axis to a minor axis not smaller than 2, more preferably, not smaller than 4. The axial ratio may be suitably set to a value, but the crystal grains each having an axial ratio not larger than 15 can easily be formed. The aforementioned magnetic recording medium can be formed by means of controlling the form of the non-magnetic underlayer in the atmosphere of an Ar gas having a high concentration of about 10 mTorr before the magnetic layer is formed. The magnetic layer which is formed of a metal magnetic thin film containing Co as a main component is preferable. Although the object of the present invention can be attained without any non-magnetic subbing layer, it is more preferable, in the viewpoint of magnetic characteristics, to provide a nonmagnetic underlayer containing Cr, Mo, W or the like in bcc structure on which epitaxial growth of the Co magnetic layer easily occurs. It is particularly preferable, in the viewpoint of recording/reproducing characteristics, to select the thickness of the non-magnetic subbing layer to a value within a range of from 100 Å to 5000 Å, inclusively. Further, it is more preferable, in the viewpoint of reliability, that the magnetic layer is formed of a metallic magnetic thin film mainly containing Co, Ni and Zr, mainly containing Co, Ni and Hf, mainly containing Co, Cr and Zr, or mainly containing Co, Cr and Hf.

Further, a non-magnetic overcoating layer having a thickness within a range of from about 100 Å to about 1000 Å. A may be provided on the upper surface of the magnetic layer.

BRIEF DESCRIPTION OF THE DRAWINGS

Other features and advantages of the present invention will be apparent from the following description taken in connection with the accompanying drawings, wherein.

DETAILED DESCRIPTION OF THE INVENTION

EMBODIMENTS (I)

Figure 3A:
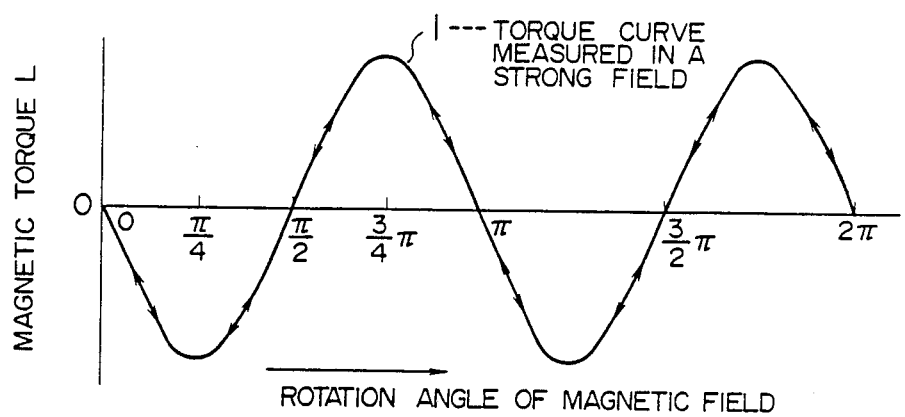
FIG. 3A is a torque curve graph in the case where the magnetic torque of the magnetic thin film sample is measured in the condition of high magnetic field intensity.
Figure 3B:
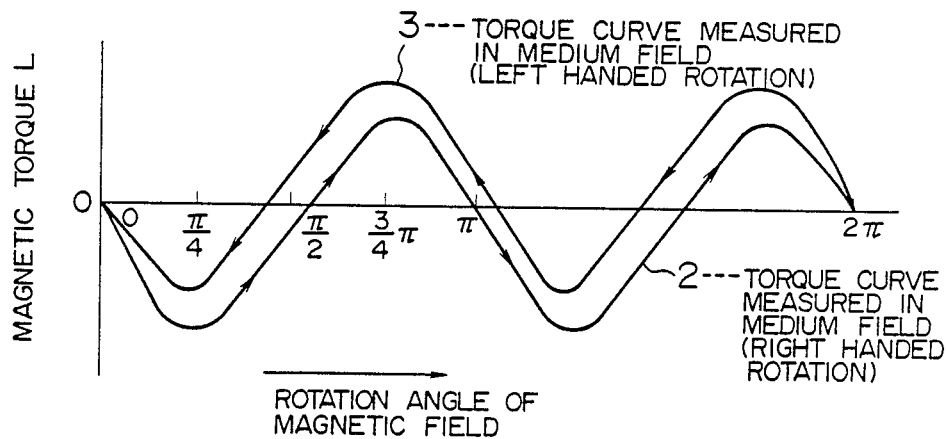
FIG. 3B is a torque curve graph in the case where the magnetic torque of the magnetic thin film sample is measured in the condition of medium magnetic field intensity.

Embodiments of the magnetic recording medium according to the first aspect of the present invention will be described specifically. Generally, when a strong rotating magnetic field is applied to a magnetic thin film sample for the purpose of measuring the magnetic anisotropy of the magnetic thin film sample by use of a torque magnetometer a torque curve symmetric with respect to 180° as shown in FIG. 3A can be obtained. If the magnetic field is rotated in the reverse direction after it has been rotated by 360° in one direction, the magnitude of torque will trace the curve which has been drawn in the rotation in the direction to thereby cause no hysteresis. On the contrary, assuming that the magnetic field is gradually weakened, and if the magnetic field is rotated in the reverse direction after it has been rotated by 360° in one direction, the magnitude of torque can not trace the curve which has been drawn in the rotation in the one direction and hysteresis will appear as shown in FIG. 3B. The area Wr surrounded by two curves as shown in FIG. 3B is called "rotational hysteresis loss" and depends on the intensity of magnetic field, the area Wr being represented by the equation $Wr = \frac{1}{2}\int_0^{2\pi} Ld\theta = \int_0^{2\pi} Ld\theta$ in which L represents the magnitude of torque per unit volume of the sample and $\theta$ represents the rotation angle thereof. Further, the integrated value of rotational hysteresis loss $R_H$ ($R_H = \int_0^{\infty} Wr/Is\, d(1/H)$) is calculated by integrating the quotient obtained by dividing the rotational hysteresis loss Wr by the saturation flux density Is, with respect to the reciprocal of magnetic field intensity H. The integrated value of rotational hysteresis loss $R_H$ can be used as a standard for expressing the magnetization process in the magnetic thin film. Generally, in the case where the magnetization process obeys a coherent rotation model, $R_H$ value is 0.4. As the magnetization process due to the magnetic domain wall displacement occurs, the value, $R_H$ increases. In the case where the magnetization process perfectly depends on the 180° movement of domain, $R_H$ is 4.0. The magnetic thin film in the magnetic recording medium according to the present invention is formed of a metal of Co, Ni or Fe or an alloy containing one element or more selected from Co, Ni and Fe as main components. For the purpose of reducing the integrated value of rotational hysteresis loss $R_H$, it is preferable that the metal or alloy contains at least one non-magnetic element selected from the group including Cu, V, Zr, Ru and so on, in the proportion of from 0.1 atomic percent to 15 atomic percent, more preferably, in the proportion of from 3 atomic percent to 8 atomic percent. If the content of the aforementioned nonmagnetic element is less than 0.1 atomic percent, the effect of reducing noise can not be expected. If the content of the non-magnetic element is more than 15 atomic percent, both the coercive force and the saturation magnetization intensity decrease, and undesirably, the original function of the magnetic recording medium itself deteriorates.

The establishment of the integrated value of rotational hysteresis loss $R_H$ within a range of from 0.4 to 1.3 in the magnetic recording medium according to the present invention means that the mechanism of magnetic inversion in the magnetic thin film used as a magnetic recording medium has to obey the coherent rotation model as much as possible, or in other words, means that the magnetization process due to the domain wall displacement has to be suppressed as sufficiently as possible for the purpose of reducing magnetic recording medium noise. In the case where the integrated value of rotational hysteresis loss $R_H$ is smaller than 0.4, the magnetic thin film cannot exist logically as a magnetic material In the case where $R_H$ is larger than 1.3, the size of domain increases and consequently the noise of the magnetic recording medium undesirably increases.

Further, a suitable amount of a non-magnetic element such as Cu, V, Zr, Ru or the like may be added to the magnetic thin film according to the present invention. The addition of the non-magnetic element provides the effect of lowering the integrated value of rotational hysteresis loss to thereby provide a high S/N medium.

In the following, referring to the drawings, the present invention is described in more detail with reference to the examples thereof.

(EXAMPLE I-1)

Surfaces of substrates respectively formed of a Cu-Sn-plated Al-Mg alloy with the diameter of 130 mm were polished like a mirror, degreased with alkali and washed with water. After washing, chemical Ni-P films having various thicknesses within a range of from 0 to 1000 Å were respectively plated on the surfaces of the substrates, and then 750 Å thick Co magnetic thin films containing 20 atomic percent of Ni and 0.8 atomic percent of P were respectively formed on the surfaces of the resulting materials by electroplating. Further, the thus prepared plated disks were heated to 300° C. in the air, and then the surfaces thereof were oxidized for 50 minutes to form a deep-blue oxide protective film.

Figure 1:
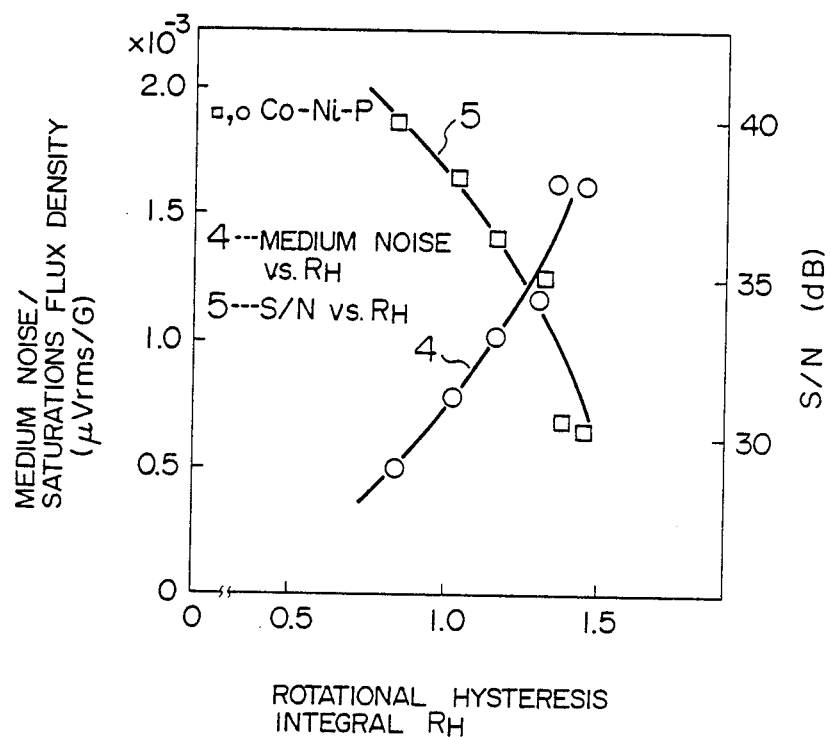
FIG. 1 is a graph view showing the relation among the medium noise, the SN ratio and the rotational hysteresis integral in a magnetic recording disk prepared in an embodiment according to the first aspect of the present invention.

The reproductive output signal and noise in the plated disks prepared as described above were measured in such a manner as follows. The recording/reproducing characteristics of the disks were measured by using a ring type magnetic head having a track width of 31 $\mu$m and a gap length of 0.8 $\mu$m in the conditions of the floating height of 0.2 $\mu$m and the heat-to-medium relative velocity of 20 m/sec. After the measurement of recording/reproducing characteristics, 6 mm square samples were successively cut out from the disks. The hysteresis curves of the samples were found by a sample-vibrating magnetometer, and consequently, the saturation flux density Is, the coercive force Hc and the remanence ratio Ir/Is were measured. On the other hand, the integrated value of rotational hysteresis loss $R_H$ was found by a torque magnetometer on the basis of the aforementioned method. The relation among the magnetic recording medium noise per saturation flux density ($\mu$V rms/G), the SN ratio (dB) and the integrated value of rotational hysteresis loss $R_H$ was shown in FIG. 1. As the magnetic thin film samples used in the measurement were different in saturation flux density Is, the magnetic recording medium noise N was normalized by the saturation flux density Is.

It is apparent from the drawing that the medium noise N and the integrated value of rotational hysteresis loss $R_H$ have a definite relation, and that the medium noise decreases as the integrated value of rotational hysteresis loss $R_H$ decreases. Particularly, when the value $R_H$ is smaller than 1.3, the magnetic recording medium is so excellent in magnetic characteristics that the SN ratio is larger than 35 dB.

(EXAMPLE I-2)

Surfaces of substrates respectively formed of an Ni-P-plated Al-Mg alloy with the diameter of 130 mm were polished like a mirror and washed with water. After washing, the substrates were heated to 150° C., and 2500 Å thick Cr films were respectively formed on the substrates by DC magnetron sputtering in the various conditions of Ar gas pressure of 5, 10 and 15 mTorr and driving electric power of 1.6, 6.4 and 16 W/cm$^2$. After the formation of the Cr films, 600 Å thick magnetic thin films of a Co alloy containing 30 atomic percent of Ni, containing 30 atomic percent of Ni and 5.5 atomic percent of Cu, and containing 30 atomic percent of Ni and 11 atomic percent of V, were respectively formed in the various conditions of Ar gas pressure and driving electric power. Further, 400 Å thick carbon layers were sequentially formed as protective layer.

The recording/reproducing characteristics, the magnetic characteristics and the integrated value of rotational hysteresis loss $R_H$ in the disks were measured in the same manner as described above in Example I-1. The results of measurement were shown in FIG. 2.

Figure 2:
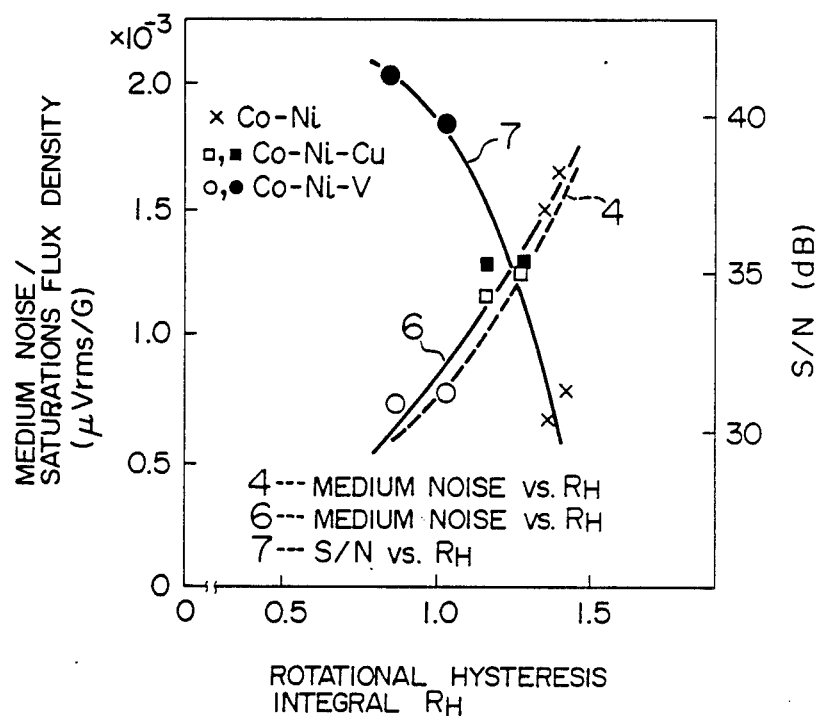
FIG. 2 is a graph view showing the relation among the medium noise, the SN ratio, and the rotational hysteresis integral in a magnetic recording disk prepared in another embodiment according to the first aspect of the present invention.

It is apparent from the drawing that when the element such as Cu or V is added to the magnetic thin film, the magnetic recording medium noise is reduced to thereby improve the SN ratio. Also in this example, the medium noise decreases as the integrated value of rotational hysteresis loss $R_H$ decreases. The noise-$R_H$ curve of Example I-2 shown by the solid line 6 in FIG. 2 is similar to that of Example I-1 which is shown by the broken line 4 in FIG. 2. Accordingly, it is also understood in Example I-2 that when the integrated value of rotational hysteresis loss $R_H$ is smaller than 1.3, the SN ratio is larger than 35 dB.

(EXAMPLE I-3)

Magnetic disks were prepared in the same manner as described above in Example I-2, except that the magnetic thin films used in Example I-3 were respectively formed of a Co alloy containing 30 atomic percent of Ni and 5 atomic percent of Zr, and containing 30 atomic percent of Ni, 4 atomic percent of Zr and 1 atomic percent of Ru in order to improve the corrosion resistance of the magnetic thin films. The recording/reproducing characteristics, the magnetic characteristics and the integrated value of rotational hysteresis loss $R_H$ in the disks were measured in the same manner as described above in Example I-1. As the results of measurement, in the case where the magnetic thin film of the magnetic disk was formed of a Co alloy containing 30 atomic percent of Ni and 5 atomic percent of Zr, the integrated value of rotational hysteresis loss $R_H$ was 1.1, the magnetic disk noise per saturation flux density was $1.0 \times 10^{-3}$ $\mu$V rms/G and the SN ratio was 38 dB. In the case where the magnetic thin film of the magnetic disk was formed of a Co alloy containing 30 atomic percent of Ni, 4 atomic percent of Zr and 1 atomic percent of Ru, the integrated value of rotational hysteresis loss $R_H$, the magnetic disk noise per saturation flux density, and the SN ratio were 0.9, $0.5 \times 10^{-3}$ $\mu$V rms/G, and 42 dB, respectively. The resulting values were located substantially on the curves shown in FIGS. 1 and 2.

It is apparent from the above description that the noise and the integrated value of rotational hysteresis loss $R_H$ have a definite relation regardless of the difference in composition of the magnetic film and regardless of the difference in method of producing the magnetic thin film, such as plating, sputtering and the like. This shows that reduction of the integrated value of rotational hysteresis loss $R_H$ in the magnetic thin film is essential for low noise and high SN ratio of the magnetic recording medium of the ferromagnetic thin film type.

As described above, the magnetic recording medium of the ferromagnetic thin film type according to the present invention in which the integrated value of rotational hysteresis loss $R_H$ is within a range of from 0.4 to 1.3 is so superior in reliability and in SN ratio that the medium noise can be reduced remarkably.

EMBODIMENTS (II)

In the following, embodiments in the magnetic recording medium according to the second aspect of the present invention are described specifically.

The effects according to the second aspect of the present invention which have been described above initially are attained by the following functions. An Al alloy disk substrate with a diameter of 89 mm and a thickness of 1.9 mm, which was coated with Ni containing 12 percent by weight of P by 15 $\mu$m and polished like a mirror, a glass disc substrate with a diameter of 89 mm and a thickness of 1.9 mm, and a polyimide film substrate were washed with pure water. Just after the substrates were washed with pure water or after the substrates were left in a clean room for a week after washing, 4000 Å thick Cr films were respectively formed on the substrates by RF magnetron sputtering in the atmosphere of Ar gas of 10 mTorr at room temperature under the various conditions of driving electric power of 8 W/cm$^2$ and 1 W/cm$^2$. After the formation of the Cr films, the surface morphology of the substrates were observed with a high-resolution scanning electron microscope. As the result of observation, in the cases where the Cr films were formed under the condition of 8 W/cm$^2$, the most surfaces of crystal grains on either substrate were shaped like a polygon near a circle and had a diameter of about 700 Å. On the contrary, in the cases where the Cr films were formed under the condition of 1 W/cm$^2$, the most surfaces of crystal grains on either substrate were shaped like an ellipsoid with the axial ratio of from 4 to 7 or shaped like a needle, so that the grain width taken in the direction of the minor axis thereof was about 300 Å. In the cases where the Cr films were respectively formed on the polyimide substrate, the glass substrate, and the Ni-P-plated Al alloy substrate being left for a week after washing, the crystal grains were substantially randomly arranged in the direction of the major axis thereof. This is because the surface energy of the substrates was so small that the nuclei of the crystal grains could be produced relatively freely. That phenomenon was also recognized in the cases of Mo, W and an alloy thereof. In short, it was apparent that the growth of the crystal grains can be controlled according to the surface energy condition of the substrate and the film forming condition through the alloy thin film containing at least one element selected from the group of Cr, Mo, W and mixtures thereof. After three days from washing with pure water, a 4000 Å thick Cr film was formed on the Ni-P-plated Al alloy substrate having a diameter of 130 mm by RF magnetron sputtering in the atmosphere of 10 mTorr Ar gas under the various conditions of driving electric power of 8 W/cm$^2$ and 1 W/cm$^2$. Successively after the formation of the Cr film, a 750 Å thick Co-Ni-Zr alloy film was formed under the condition of 2 W/cm$^2$ by use of a Co alloy target containing 5 atomic percent of Zr and 36 atomic percent of Ni. Successively after the formation of the Co-Ni-Zr alloy film, a 400 Å thick C film was formed under the condition of 5 W/cm$^2$. Lastly, a lubricant of perfluoroalkyl polyether was applied to the resulting surface to a thickness of 40 Å to prepare a magnetic disk. The recording/reproducing characteristics of the disk was estimated, and the surface of the disk was observed with a high-resolution scanning electron microscope. As a comparative example, another disk was prepared without the C and lubricant films, and the surface thereof was also observed with the high-resolution scanning electron microscope. As the results of observation, the surface morphology with the C and lubricant films was substantially the same as that of the surface without the C and lubricant films. In the case where the condition for forming the Cr film was 8 W/cm$^2$, the most surfaces of crystal grains in the magnetic film were shaped like a polygon near a circle and had a diameter of about 700 Å. On the contrary, in the case where the condition for forming the Cr film was 1 W/cm$^2$, the surfaces of crystal grains in the magnetic film were shaped like an ellipsoid with the axial ratio of from 4 to 7 or shaped like a needle. The grains in the magnetic film were shaped like an ellipsoid with the axial ratio of from 4 to 7 or shaped like a needle. The grain width taken in the direction of the minor axis thereof was about 300 Å, and the grain length taken in the direction of the major axis thereof varied widely. The aforementioned surface morphology is considered to be a reflex of surface morphology of the underlayer. Accordingly, the form of crystal grains of the magnetic film can be controlled by controlling the form of crystal grains of the underlayer, because the crystal of Cr and the crystal of Co-Ni-Zr match so well that the crystal of Co-Ni-Zr can grow on the crystal of Cr epitaxially.

This effect was recognized in the case of a Co alloy containing Co as a main component, such as for example Co-Cr, Co-Re, Co-Pt, Co-Al, Co-Mo, Co-Fe, Co-Ni, Co-Fe-Cr, Co-Ni-Hf, Co-Ni-Ti, Co-Cr-Zr, Co-Cr-Ti, Co-Ni-0, Co-Ni-Zr-0, Co-Fe-Mo, Co-Fe-W, Co-Fe-Zr, and the like. However, in the case where the total amount of such additive elements was larger than about 60 atomic percent, the crystal of the Co alloy and the crystal of the underlayer did not match because of the difference in crystal form between Co and the additive element so that the form of crystal grains in the Co alloy film could not be controlled by controlling the form of crystal grains in the underlayer, so that the form of crystal grains in the Co alloy film became substantially cylindrical, regardless of the film forming conditions.

While changing Ar gas pressure successively to be 3, 5, 7, 10, 15, 20 and 30 mTorr and while changing driving electric power for forming the Cr film successively to be 0.5, 1, 2, 3, 4, 5, 6, 8 and 10 W/cm$^2$, the same experiment by DC sputtering was carried out for the purpose of more detailed examination. As the result of experiment, the axial ratio of crystal grains could be improved to be not smaller than 2, in the cases where the Ar gas pressure was not lower than 10 mTorr and the driving electric power was not larger than 4W/cm$^2$. Further, the recording/reproducing characteristics of those media were estimated. As the result of estimation, low-noise and high-S/N media as shown in FIG. 2 could be produced in the cases where the axial ratio was not smaller than 2. This is because when the axial ratio of crystal grains in the Co-Ni-Zr magnetic layer increases to be not smaller than 2, not only are the crystal grains separated from one another to make magnetic interaction low, but also the magnetization components in a plane increase due to shape anisotropy to make so-called saw-tooth like domain width narrow to thereby produce a sharp magnetization transition region. Further, it was found that noise increased as the length d in the minor axis increased. Accordingly, it is preferable that the length d is smaller than 300 Å. The axial ratio in the case of DC sputtering was relatively small compared with the case of Rf sputtering.

On the other hand, with respect to the arrangement of the crystal grains in the major axis, the grains were substantially randomly arranged in the case where Ar gas pressure was high. The random arrangement of the grains decreases as the driving electric power increases, and the random arrangement depends on the magnitude of surface energy of the substrate. Assuming now that the surface energy is not larger than 300 erg/cm$^2$, the grains are almost perfectly randomly arranged in the case where the Cr film is formed under the condition of driving electric power of 4 W/cm$^2$, so that modulation at the time of recording/reproducing becomes less than 5%. This is because the grains can be evenly arranged easily without disturbance or influence of temperature distribution since Cr can grow more freely as the surface energy of the substrate decreases, and consequently, the magnetic characteristics of the magnetic film becomes isotropic. Although this embodiment has shown the case where Cr is used as the non-magnetic layer, it is a matter of course that the present invention is not limited to the specific embodiment and that the same effect can be recognized in the cases of Mo, W and the like. Although this embodiment has shown the case where the film is formed by sputtering, it is to be understood that the present invention is also not limited to the specific embodiment and that the same effect can be recognized in the cases of evaporating, ion-beam sputtering and the like.

As described above, the recording/reproducing characteristics of the medium can be remarkably improved by controlling the surface morphology of the underlayer or magnetic layer.

Further, in the viewpoint of recording/reproducing characteristics, it is preferable to select the thickness of the non-magnetic overcoating layer to be smaller than 1000 Å for the purpose of high-density recording of practical use, because spacing loss is determined by the thickness of the non-magnetic overcoating layer.

Although this embodiment has shown the case where the magnetic layer is formed of Co-Ni-Zr alloy, the same effect can be recognized in the cases of any other Co alloy, such as Co-Fe, Co-Ni, Co-Pt, Co-Cr, Co-Cr-Zr, Co-Cr-Ni and the like. Further, the Co-Ni or Co-Cr alloy thin film containing Zr or Hf as an additive element is also superior in corrosion resistance.

(EXAMPLE II-1)

Figure 4:
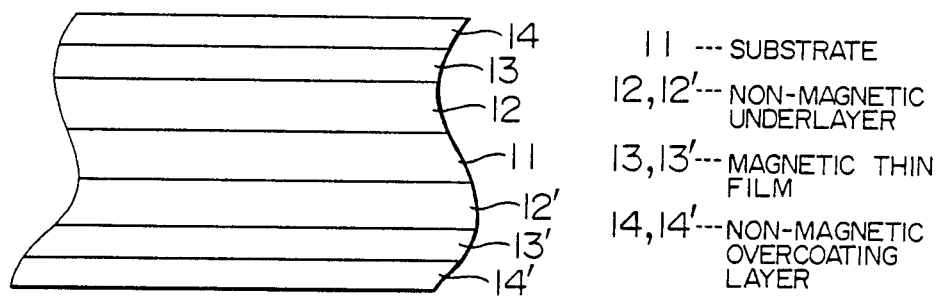
FIG. 4 is a sectional view showing an embodiment according to the second aspect of the present invention.
Figure 5:
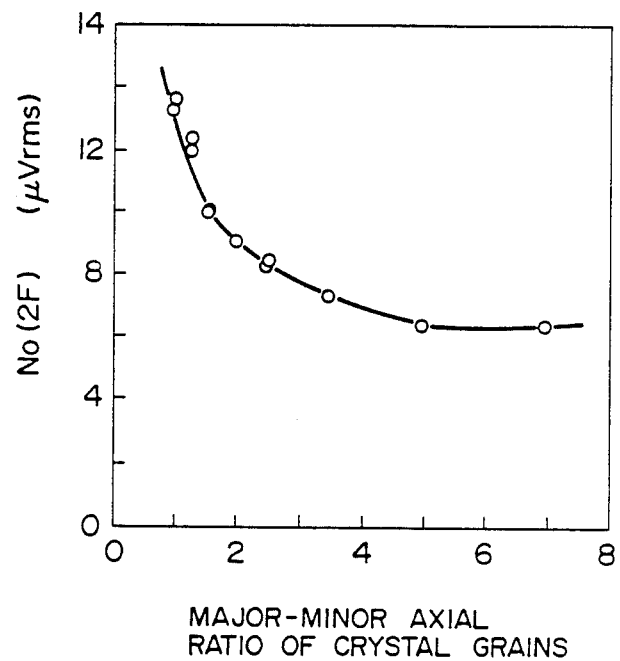
FIG. 5 is a graph view showing the relation between the noise and the axial ratio in crystal grain size.

In the following, the present invention is described more specifically as to Example II-1 with reference to FIG. 4. In the drawing the reference numeral 11 designates a substrate formed of a material selected from the group of Al-Mg alloy having Ni-P or Ni-W-P plated layer, Alumilite-treated surface, glass, ceramics and the like. The reference numerals 12 and 12' designate underlayers formed of Cr, Mo, W or the like. The reference numerals 13 and 13' designate magnetic layers formed of a material selected from the group of Co-Ni, Co-Cr, Co-Re, Co-Pt, Co-Ni-Zr, Co-P, Co-Ni-P, Co-Ni-Ti, Co-Fe, Co-Ni-Y, Co-Ni-Zr-Ru and the like. The reference numerals 14 and 14' designate non-magnetic overcoating layers formed of C, B, $B_4C$, $SiO_2$, Rh or the like. Further, organic lubricant layers may be provided on the non-magnetic coating layers. In the following, the Example II-1 of the present invention is described more in detail.

A chemically reinforced glass substrate 11 having an external diameter of 130 mm, an internal diameter of 40 mm and a thickness of 1.9 mm, was washed with water. Just after washing, 5000 Å thick non-magnetic underlayers 12 and 12' of Cr were formed onto the surfaces of the substrate 11 heated to 150° C. by DC magnetron sputtering in the atmosphere of Ar gas containing 0.05 percent of $O_2$ under the conditions of gas pressure of 15 mTorr and DC driving electric power of 1.6 W/cm$^2$, and then 600 Å thick magnetic films 13 and 13' of a Co alloy containing 40 atomic percent of Ni, 5 atomic percent of Zr and 1 atomic percent of Hf were successively formed onto the surfaces of the resulting substrate under the condition of 2 W/cm$^2$. Lastly, 500 Å thick nonmagnetic coating layers 14 and 14' of C were successively formed onto the surfaces of resulting substrate under the condition of 5 W/cm$^2$ to prepare a magnetic disk.

The magnetic disk was set in a magnetic disk unit and recording/reproducing characteristics were estimated using an Mn-Zn ferrite head with the effective gap length of 0.5 μm under a condition of the relative velocity of 13.5 m/S and floating height of 0.22 μm. As the result of estimation, high performance as shown in Table 1 was obtained. The disk was good in modulation, the modulation being 5%. Further, the surfaces of the disk were observed with a high-resolution scanning electron microscope. As the result of observation, the axial ratio of crystal grains was within a range of from 2.5 to 5 in the cases where the non-magnetic underlayers were formed under the conditions of 15 mTorr and 1.6 W/cm$^2$ as described above. As a comparative example, in the cases where the non-magnetic underlayers were formed under the conditions of 5 mTorr and 4.8 W/cm$^2$, the axial ratio of crystal grains was not larger than 1.2, and the SN ratio was so low as to be 3.76.

It has become apparent from the aforementioned results that noise can be reduced as the axial ratio of crystal grains increases and the SN ratio can be improved.

TABLE 1

| Sample no. | Sputtering Gas Press. | Driving Elec. power | $D_{50}$ (kFCI) | O/W S/N (dB) | $N_D(2F)$ (μVrms) | S/N (2F) |
|---|---|---|---|---|---|---|
| 1 | 15 mTorr | 1.6 W/cm$^2$ | 27.4 | 30.1 | 6.44 | 7.34 |
| 2 | 5 | 4.8 | 24.7 | 28.0 | 11.1 | 3.76 |

(EXAMPLE II-2)

An Ni-P-plated Al alloy substrate 11 having an external diameter of 130 mm, an internal diameter of 40 mm and a thickness of 1.9 mm, was washed with water. After the substrate 11 was left for three days as it was, 4000 Å thick non-magnetic underlayers 12 and 12' of Cr were formed on the surfaces of the substrate 11 heated to 120° C. by DC magnetron sputtering in the atmosphere of Ar gas under the conditions of gas pressure of 20 mTorr and RF driving electric power of 2 W/cm$^2$, and then 600 Å thick magnetic films 13 and 13' of a Co alloy containing 30 atomic percent of Ni, 5.5 atomic percent of Zr and 0.2 atomic percent of Hf were successively formed onto the surfaces of the resulting substrate under the condition of 2 W/cm$^2$. Lastly, 400 Å thick non-magnetic overcoating layers 14 and 14' of C were successively formed onto the surfaces of resulting substrate under the condition of 6 W/cm$^2$ to prepare a magnetic disk.

The magnetic disk was set in a magnetic disk unit and recording/reproducing characteristics were estimated using an Mn-Zn ferrite head with the effective gap length of 0.4 μm under a condition of the relative velocity of 20 m/S and the floating height of 0.25 μm. As the result of estimation, high performance as shown in Table 2 was obtained. The modulation in the disk was 7% and relatively slightly larger compared with the case of Example II-1 where a glass substrate was used. There was, however, no problem in practical use. Further, the surfaces of the disk were observed with a high-resolution scanning electron microscope. As the result of observation, the axial ratio of crystal grains was within a range of from 5 to 8 in the cases where the non-magnetic underlayers were formed under the conditions of 20 mTorr and 2 W/cm$^2$ as described above.

As a comparative example, in the cases where the Cr layers and magnetic layers were formed under the conditions of 4 mTorr and 6 W/cm², the axial ratio of crystal grains was not larger than 1.5.

It has become apparent from the aforementioned results that noise can be reduced as the axial ratio of crystal grains increases to thereby improve the SN ratio.

TABLE 2

| Sample No. | Sputtering Gas Press. | Driving Elec. Power | $D_{50}$ (kFCI) | O/W S/N (dB) | $N_D(2F)$ ($\mu$Vrms) | $S/N_D$ (2F) |
|---|---|---|---|---|---|---|
| 3 | 20 mTorr | 2 W/cm² | 28.4 | 30.7 | 7.1 | 6.8 |
| 4 | 4 | 6 | 25.7 | 28.5 | 10.7 | 4.0 |

(EXAMPLE II-3)

An Al alloy was plated with 15 $\mu$m thick Ni-P and then the surfaces of the resulting material were polished like a mirror so that the center-line average roughness (Ra) of the surfaces was 3 nm to prepare an Ni-P-plated Al alloy substrate 11. Another Ni-P-plated Al alloy substrate 11 was prepared in the same manner as described above, except that the surfaces were circumferentially slightly injured to change the surface roughness to 7 nm. Just after each substrate 11 was washed with Freon, nonmagnetic underlayers 12 and 12' of Cr having various thicknesses of 1000 Å, 2500 Å and 5000 Å were formed onto the surfaces of the substrates 11 heated to 100° C. by RF conventional sputtering in the atmosphere of Ar gas under the conditions of gas pressure of 15 mTorr and RF driving electric power of 2 W/cm², and then 600 Å thick magnetic films 13 and 13' of two Co alloys, that is, one containing 35 atomic percent of Ni and 9 atomic percent of Zr, the other containing 30 atomic percent of Ni and 7 atomic percent of Zr, were successively formed onto the surfaces of the resulting substrate under the condition of 2 W/cm². Lastly, 400 Å thick non-magnetic overcoating layers 14 and 14' of C were successively formed onto the surfaces of resulting substrate under the condition of 6 W/cm² to prepare a magnetic disk, respectively. Each magnetic disk was set in a magnetic disk unit and recording/reproducing characteristics were estimated using an Mn-Zn ferrite head with the effective gap length of 0.4 $\mu$m under a condition of the relative velocity of 20 m/s and the floating height of 0.25 $\mu$m. As the result of estimation, modulation and noise were reduced as the thickness of the Cr layer increased to be larger than 1000 Å, so that the SN ratio was improved to be larger than 7. However, in the case where the thickness of the Cr layer increased to be larger than 5000 Å, the surface of the medium became so rough that the disk had undesirable disadvantages in floating property and manufacturing efficiency.

As described above, according to the present invention, modulation and noise can be reduced to improve the SN ratio, so that high-performance magnetic recording media can be provided.

We claim:

1. A magnetic recording medium comprising a non-magnetic substrate and a magnetic thin film provided on said non-magnetic substrate so as to serve as a magnetic recording layer, said magnetic thin film being formed in a manner so that when rotational hysteresis loss Wr expressed by an equation (1) of a specimen sampled from said magnetic thin film $$WR = \int_0^{2\pi} Ld\theta \quad (1)$$

is obtained by using a torque magnetometer while rotating a magnetic field (L and $\theta$ representing a magnitude of torque per unit volume of said magnetic thin film sample and a rotation angle of magnetic field, respectively,) an integrated value of rotational hysteresis loss $R_H$ represented by the equation (2)

$$R_H = \int_0^\infty Wr/Is \, d(1/H) \quad (2)$$

is within a range of from 0.4 to 1.3, Is and H representing saturation magnetization flux density of said magnetic thin film and intensity of said magnetic field, respectively.

2. A magnetic recording medium according to claim 1, in which said magnetic thin film is formed of a metal containing a main element selected from the group containing of Co, Ni and Fe, said metal further containing at least one element selected from the group consisting of Cu, V, Zr and Ru in a proportion of from 0.1 atomic percent to 15 atomic percent.

3. A magnetic recording medium according to claim 1, wherein said magnetic thin film contains crystal grains substantially randomly arranged on an upper surface of said magnetic thin film so that each grain is in the form of an ellipsoid or needle having an axial ratio not smaller than 2.

4. A magnetic recording medium according to claim 3, in which each of said crystal grains has an axial ratio not smaller than 4.

5. A magnetic recording medium according to claim 3 or 4, in which each of said crystal grains has a width not larger than 400 Å.

6. A magnetic recording medium according to claim 3, in which said magnetic layer is formed of a metal magnetic thin film containing Co as a main component.

7. A magnetic recording medium according to claim 3, in which an underlayer having bcc structure is interposed between said substrate and said magnetic layer.

8. A magnetic recording medium according to claim 3, in which said magnetic layer is formed of one alloy selected from the group consisting of an alloy mainly containing Co, Ni and Zr, an alloy mainly containing Co, Ni and Hf, an alloy mainly containing Co, Cr and Zr, and an alloy mainly containing Co, Cr and Hf.

9. A magnetic recording medium according to claim 8, in which said underlayer contains one element selected from the group consisting of Cr, Mo and W as a main component.

10. A magnetic recording medium according to claim 8, in which said underlayer has a thickness of from 100 Å to 5,000 Å, inclusively.

11. A continuous magnetic recording medium comprising a substrate, and a thin film metal magnetic layer consisting of metal containing crystal grains substantially randomly arranged on an upper surface of said magnetic layer so that each grain is in the form of an ellipsoid or needle having an axial ratio not smaller than 2.

12. A continuous magnetic recording medium according to claim 11, in which each of said crystal grains has an axial ratio not smaller than 4.

13. A continuous magnetic recording medium according to claim 4 or 12, in which each of said crystal grains has a width not larger than 400 Å.

14. A continuous magnetic recording medium according to claim 11, in which said magnetic layer is formed of a metal magnetic thin film containing Co as a main component.

15. A continuous magnetic recording medium according to claim 11, in which an underlayer having bcc structure is interposed between said substrate and said magnetic layer.

16. A continuous magnetic recording medium according to claim 15, in which said underlayer contains one element selected from the group consisting of Cr, Mo and W as a main component.

17. A continuous magnetic recording medium according to claim 15, in which said underlayer has a thickness of from 100 Å to 5000 Å, inclusively.

18. A continuous magnetic recording medium according to claim 11, in which said magnetic layer is formed of one alloy selected from the group consisting of an alloy mainly containing Co, Ni and Zr, an alloy mainly containing Co, Ni and Hf, an alloy mainly containing Co, Cr and Zr, and an alloy mainly containing Co, Cr and Hf.

19. A continuous magnetic recording medium according to claim 11, wherein said thin film metal magnetic layer is formed by one of sputtering and evaporation.

20. A continuous magnetic recording medium according to claim 19, wherein said thin film metal magnetic layer is formed by sputtering.

21. A continuous magnetic recording medium according to claim 20, wherein said thin film metal magnetic layer is formed by ion-beam sputtering.

22. A continuous magnetic recording medium according to claim 19, wherein said thin film metal magnetic layer is formed by evaporation.

* * * * *

UNITED STATES PATENT AND TRADEMARK OFFICE
CERTIFICATE OF CORRECTION

PATENT NO. :   4,939,045
DATED      :   July 3, 1990
INVENTOR(S):   Kazuetsu YOSHIDA et al It is certified that error appears in the above-identified patent and that said Letters Patent is hereby corrected as shown below:

On the title page, left-hand column:

"[30]  Foreign Application Priority Data
    Jul. 8, 1987 [JP]    Japan ........ 62-84731"

should read:

--[30]  Foreign Application Priority Data
    Apr. 8, 1987 [JP]    Japan ........ 62-84731--.

Signed and Sealed this

Twentieth Day of June, 1995

BRUCE LEHMAN

*Attest:*

*Attesting Officer*    *Commissioner of Patents and Trademarks*